United States Patent
Quist et al.

[11] Patent Number: 5,726,566
[45] Date of Patent: Mar. 10, 1998

[54] APPARATUS FOR MEASURING AN RF PARAMETER

[75] Inventors: Leendert B. Quist, Greensboro, N.C.; Franciscus J. Frielink, Nieuwegein, Netherlands

[73] Assignee: Lucent Technologies Inc., Murray Hill, N.J.

[21] Appl. No.: 509,683

[22] Filed: Jul. 31, 1995

[30] Foreign Application Priority Data

Oct. 29, 1994 [GB] United Kingdom ............... 9421829

[51] Int. Cl.⁶ .................................. G01R 31/22
[52] U.S. Cl. ............... 324/95; 324/754; 200/51.04
[58] Field of Search .................. 200/51.05, 51.07, 200/51.04; 324/754, 73.1, 95

[56] References Cited

U.S. PATENT DOCUMENTS

| | | | |
|---|---|---|---|
| 1,028,254 | 6/1912 | Murray | 200/51.05 |
| 1,090,489 | 3/1914 | Murray | 200/51.05 |
| 1,739,913 | 12/1929 | Pengilly | 200/51.05 |
| 3,387,104 | 6/1968 | Friend | 200/51.04 |
| 3,696,296 | 10/1972 | Nylen | 324/754 |
| 4,122,400 | 10/1978 | Medendorp . | |
| 5,126,686 | 6/1992 | Tam . | |
| 5,184,065 | 2/1993 | Chism | 324/754 |

*Primary Examiner*—Ernest F. Karlsen
*Assistant Examiner*—Jose M. Solis
*Attorney, Agent, or Firm*—Christopher N. Malvone; Jimmy Goo

[57] ABSTRACT

In apparatus for measuring the output power an RF transmitter stage (34) connected to an antenna (44) via a quarter wavelength stripline (38), a manual probe (20) is applied connect the output of the transmitter stage to a power meter (24) and connect the output end of the stripline (38) to ground. Thus, RF signals which were passed to the antenna (44) are switched to the power meter (24). All the circuitry including the antenna (44) is mounted on a printed circuit board (60) disposed within a housing (14) which has an aperture (18) to enable the probe (20) to be inserted. By providing a suitable meter, parameters other than RF power can be measured.

8 Claims, 3 Drawing Sheets

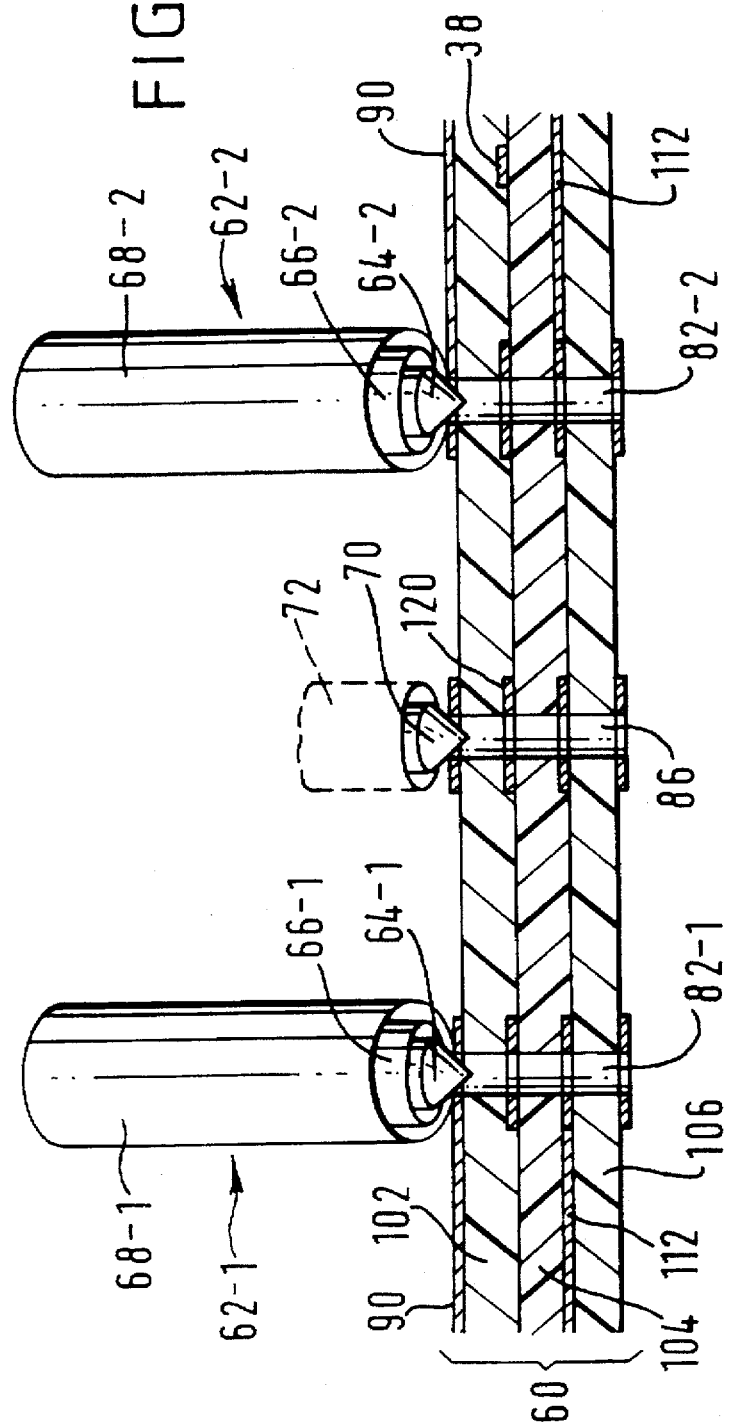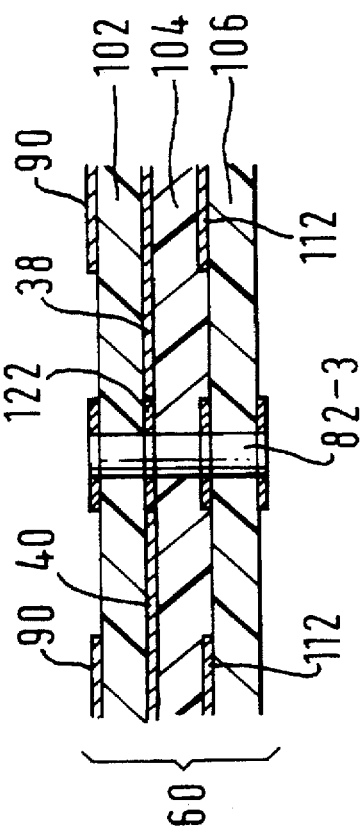

APPARATUS FOR MEASURING AN RF PARAMETER

This invention relates to apparatus for measuring an RF (radio frequency) parameter of RF signals being processed through electrical circuitry.

Where an RF circuit includes a plurality of interconnected stages, it is sometimes desired to measure an RF parameter at an interconnection point between two RF stages. For example, it may be desirable to measure the output RF power of an RF transmitter which is connected to an antenna. It has been found that it is difficult to measure RF parameters at such interconnection points without mechanical modifications such as soldering, or disconnecting a connector.

It is an object of the present invention to provide apparatus for measuring an RF parameter wherein measurement can be achieved with limited physical impact.

Therefore, according to the present invention, there is provided apparatus for measuring an RF parameter relating to a first RF stage mounted on a circuit board and having an output for RF signals, said output being connected by connection means to a second RF stage, characterized by a probe device connected to RF parameter measuring means and adapted to connect with said connection means such that RF signals on said output of said first RF stage are inhibited from passing to said second RF stage and enabled to pass via said probe device to said RF parameter measuring means.

BRIEF DESCRIPTION OF THE DRAWINGS

One embodiment of the present invention will now be described by way of example, with reference to the accompanying drawings, in which:

FIG. 4 shows a cross-sectional view of the printed circuit board, together with cooperating pins of the probe; and FIG. 5 shows a further cross-sectional view of the printed circuit board.

Figure 1:
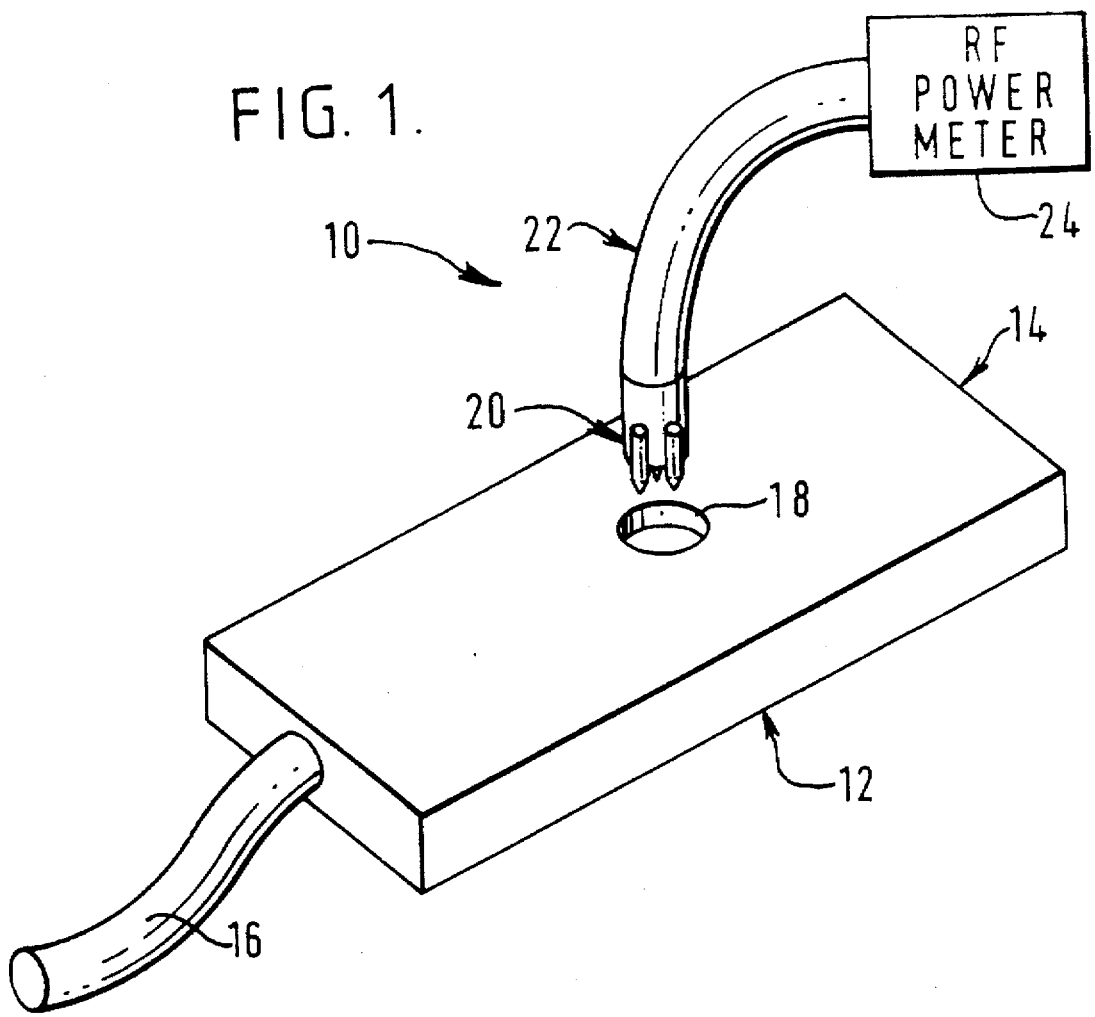
FIG. 1 is a schematic perspective view showing apparatus according to the invention, including a housing containing electronic circuitry, cooperating with a probe.

Referring first to FIG. 1, there is shown apparatus 10 for measuring RF power. The apparatus 10 includes a module 12 which comprises a housing 14 containing a printed circuit board (not shown in FIG. 1) on which is mounted electronic circuitry including an antenna. The module 12 is provided with a cable 16 which is connectable to a device such as a PC (personal computer), for example, which is to be operatively coupled to the antenna for the transmission and/or reception of RF signals. The antenna is mounted within the housing 14.

The housing 14 is provided with an aperture 18 through which can be inserted a probe 20 connected via a coaxial cable 22 to an RF power meter 24. If the measurement of another RF parameter is desired, the power meter 24 can be replaced by an appropriate measuring device for that parameter, such as, for example a spectrum measuring device for measuring the RF spectrum.

Figure 2:
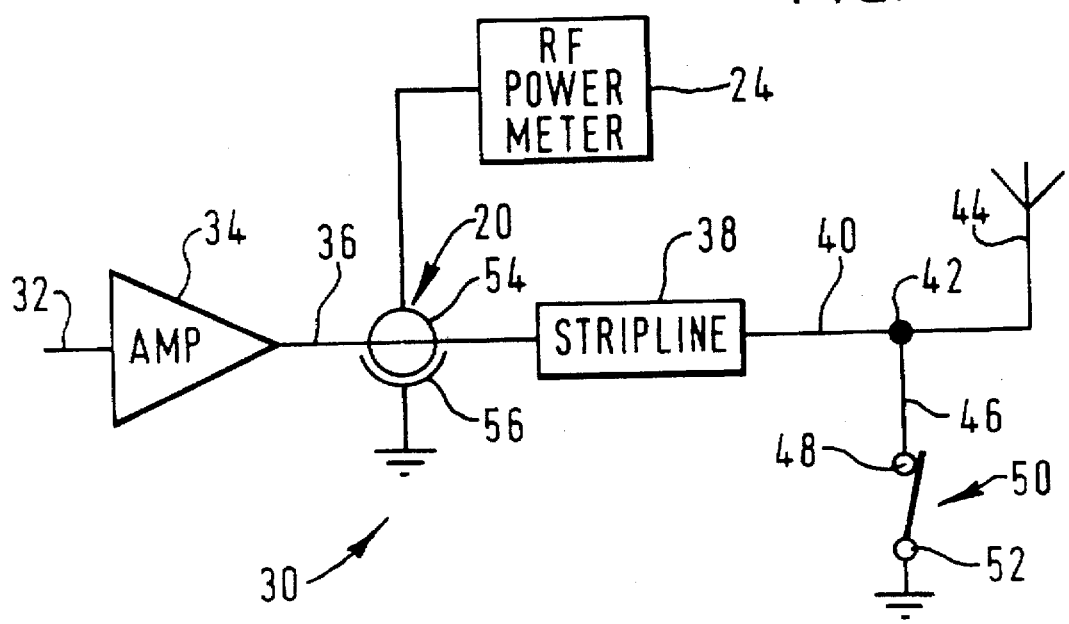
FIG. 2 is a simplified circuit diagram illustrating apparatus according to the invention.

Referring now to FIG. 2, there is shown a simplified circuit diagram of circuitry 30 included within the housing 14 (FIG. 1), and mounted on the PCB (printed circuit board) within the housing 14. A line 32, which may be supplied with a signal from other circuitry (not shown) on the PCB is connected to an RF amplifier 34 which has an output line 36 connected to a quarter wavelength stripline 38 disposed on the PCB. The quarter wavelength stripline 38 has an electrical length substantially equal to one quarter of the wavelength of the RF signals being conducted thereover. The characteristic impedance of the stripline 38 can be the same as the RF transmitter system, or can be different if it is also needed to effect impedance matching.

The stripline 38 is connected over a lead 40 to a node 42 which is connected to an antenna 44. As mentioned hereinabove, the antenna 44 is mounted on the PCB and contained within the housing 14 (FIG. 1). The node 42 is connected over a line 46 to one pole of a switch 50 which has a second pole 52 connected to ground. The probe 20 includes an inner conductor 54 and a coaxial outer conductor 56. It should be understood that when the probe 20 is correctly positioned in the aperture 18 the inner conductor makes electrical contact with the line 36 and the normally open switch 50 is caused to close as shown in FIG. 2. It will be appreciated that the quarter wavelength stripline then acts as a very high impedance thereby substantially inhibiting RF signals on the output of the amplifier 34 from passing to the antenna 44 and directing such signals to the probe 20 via which they are conveyed over the cable 22 (FIG. 1) to the RF power meter 24 for power measurement purposes.

Figure 3:
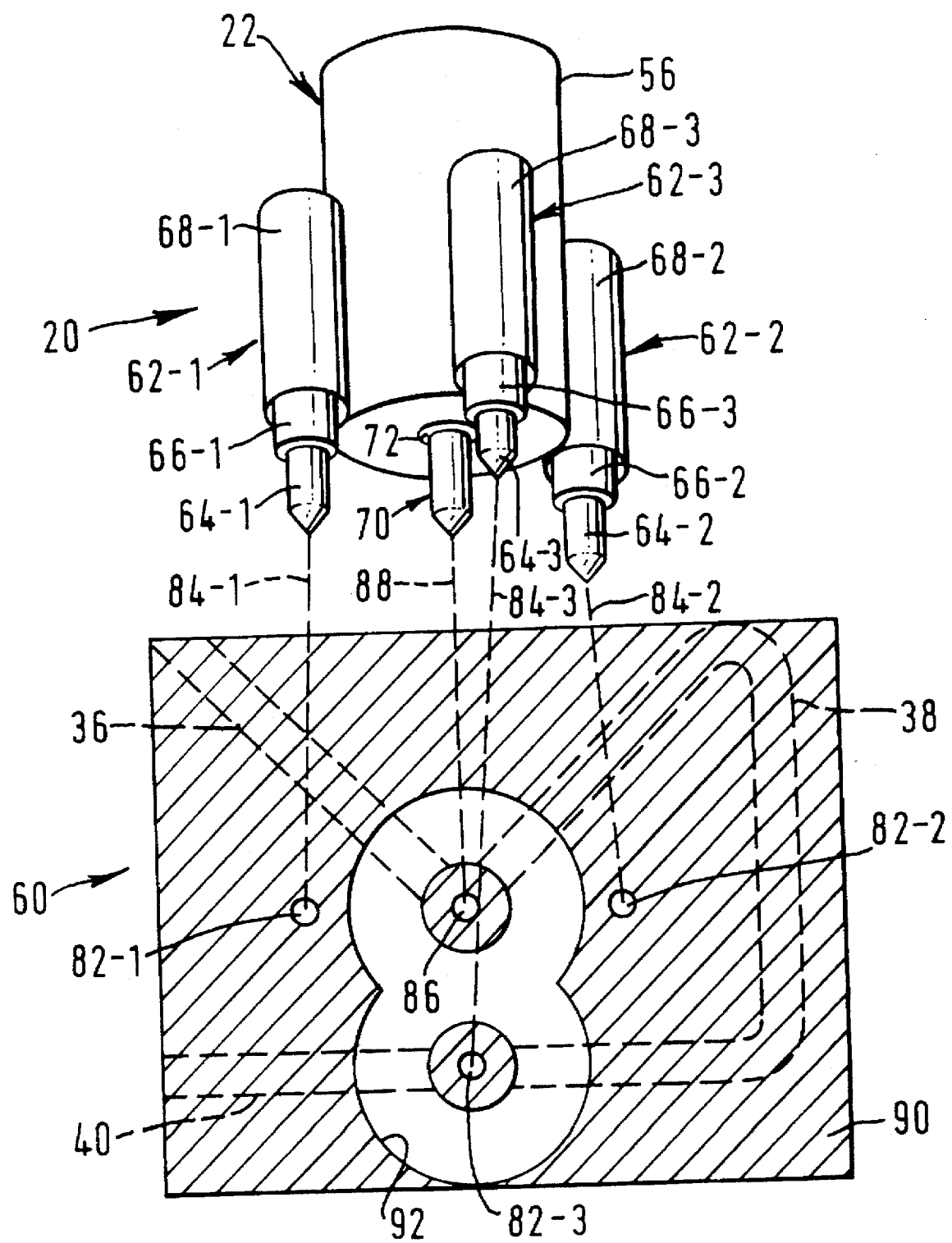
FIG. 3 shows a perspective view of the probe and a top view of a cooperating region of a printed circuit board.

Referring now to FIG. 3, there is shown a perspective view of the probe 20 together with a top view illustrating two superposed layers of conductive material located on the PCB 60. The probe 20 includes three identically structured ground pin units 62 referenced individually as 62-1 62-2 and 62-3. Each ground pin unit 62 includes a pin connector 64, reference individually as 64-1, 64-2 and 64-3. The pin connectors 64 are mounted on springs 66, referenced individually as 66-1, 66-2 and 66-3. The springs 66 are mounted within cylindrical conductive sheaths 68, referenced individually as 68-1, 68-2 and 68-3 which make electrical contact with the outer conductor 56 of the probe 20. The probe 20 also includes a centrally disposed signal pin 70 connected to the inner conductor 54 (FIG. 2) of the probe 20. The pin 70 is mounted on a spring 72.

The pin connectors 64 are adapted to cooperate with holes 82, referenced individually as 82-1, 82-2 and 82-3, respectively in the PCB 60, as shown by dashed lines 84, referenced individually as 84-1, 84-2 and 84-3. The signal pin 70 of the probe 20 cooperates with a hole 86 in the PCB 60, as shown by the dashed line 88. On the top surface of the PCB 60 is disposed an electrically conductive ground plane 90, having a cut-away portion 92. Also visible in FIG. 3 are portions of a first intermediate conductive layer, including the stripline 38 (also shown in FIG. 2) which has a loop shape so as to intersect with via holes 82-3 and 86. Also in the first intermediate conductive layer are conductive lines 36 and 40 connecting to the amplifier 34 and antenna 44, respectively.

Referring now also to FIGS. 4 and 5, there are illustrated sectional views through the PCB 60. FIG. 4 also shows a part perspective view illustrating how the ground pin units 62-1 and 62-2 and the signal pin 70 cooperate with the respective holes 82-1, 82-2 and 86 in the PCB 60. The ground pin unit 62-3 (not shown in FIG. 5) similarly cooperates with hole 82-3. The body of the probe 20 is not shown in FIGS. 4 or 5. As seen in FIGS. 4 and 5, the PCB 60 includes three insulator layers 102, 104, 106, on which are provided patterned conductive layers. The holes 82-1, 82-2, 82-3 and 86 have interior conductive coatings and act as electrically conductive vias, interconnecting the various conductive layers on the PCB 60. Thus, referring to FIG. 4, the via hole 82-1 connects the ground plane 90 to a further ground plane 112 disposed in a second intermediate conductive layer between the insulators layers 104 and 106 of the PCB 60. The via hole 82-2 also connects the ground plane 90 to the further ground plane 112. As will be appreciated, with the probe 20 in operational position, the ground planes 90 and 112 are commonly connected via the ground pin units 62-1, and 62-2 to ground the outer conductor 56 of the probe 20. The via hole 86 connects the signal pin 70 to an electrically conductive pad 120 which is connected to one end of the stripeline 38, and to the output line 36 from the amplifier 34 (FIG. 2). Referring to FIGS. 3 and 5, it is seen that the via hole 82-3 is connected to an electrically conductive pad 122 which is connected to the stripline 38, the configuration of which is best seen in FIG. 3.

The operation of the apparatus will now be described. The probe 20 is placed and held manually in position by insertion through the hole 18 (FIG. 1) in the housing 14, such that the three ground pin units 62 and the signal pin 70 contact the three via holes 82 and the via hole 86, respectively. This operation depresses the contact pins 64 and the signal pin 70 against the action of the respective springs 66 and 72. By virtue of the contacts now made through the via holes 82 and 86, previously described, it is seen that the output of the amplifier 34 (FIG. 2) is connected via the line 36 (FIGS. 2 and 3), the conductive pad 120 and the signal pin 70 to the internal conductor 54 (FIG. 2) of the probe 20 and is thereby connected to the RF power meter 24 (FIG. 1). Also, the other end of the stripline 38 is connected via the conductive pad 122 and the via hole 82-3 to the ground pin unit 62-3 which is connected to the outer conductor 56 of the probe 20 and hence via the ground pin units 62-1 and 62-2 to the conductive ground planes 90 and 112, thereby in effect acting as the switch 50 (FIG. 2) to connect the output end of the stripline 38 to ground. The effect of this is to transform the input end of the stripline 38 to an open circuit, whereby all power that during normal operation passes to the antenna 44 is passed instead to the RF power meter 24.

Although in the described embodiment the operation of the switch 50 (FIG. 2) is effected by the physical cooperation of the ground pin units 62 of the probe 20 with the ground planes 90 and 112 in the PCB 60, it should be understood that in an alternative arrangement it would be possible to apply an electrical signal via the probe to operate a switch located on the PCB 60, corresponding to the switch 50 shown in FIG. 2. In another modification, the antenna 44 could be connected to, rather than mounted on, the PCB 60 as in the described embodiment.

Thus there has been described apparatus for measuring the RF power on a PCB, which has the advantage of low cost, which is contributed to by the absence of need for additional components on the board, and small size since most of the structure can be located on the layers of the board itself. Also, high performance is achieved, since there is only a low insertion loss. Furthermore, no mechanical changes are required: manual application of the probe is sufficient. Another advantage is that measurements can be effected after final assembly.

What is claimed is:

1. Apparatus for measuring an RF parameter relating to a first RF stage mounted on a circuit board and having an output for RF signals, said output being connected by connection means to a second RF stage, said connection means having impedance means with a first connection connected to said output of said first RF stage and a second connection connected to an input of said second RF stage, said apparatus comprising:

an RF parameter measuring means; and a probe device connected to said RF parameter measuring means and adapted to connect with said connection means, wherein said probe device includes a first connector terminal adapted to connect said output of said first RF stage to said RF parameter measuring means and a second connector terminal adapted to connect said second connection of said impedance means to a reference potential such that RF signals on said output of said first RF stage are inhibited from passing to said second RF stage and enabled to pass via said probed device to said RF parameter measuring means when said probe device is connected with said connection means.

2. Apparatus according to claim 1, wherein said second RF stage is mounted on said circuit board.

3. Apparatus according to claim 1, wherein said second RF stage includes an antenna.

4. Apparatus according to claim 1, wherein said RF parameter measuring means is a power meter.

5. Apparatus according to claim 4, wherein said impedance means is a quarter wavelength stripline.

6. Apparatus according to claim 1, wherein said circuit board is mounted within a housing having an aperture for the insertion of said probe device.

7. Apparatus according to claim 6, wherein said probe device includes a third connector terminal adapted to connect to a ground plane on said circuit board.

8. Apparatus according to claim 7, wherein said probe device has a first conductor coupled to said first connector terminal and to said RF parameter measuring means, and a second conductor coupled to said second and third connector terminals.

* * * * *